United States Patent
Spitsberg et al.

(10) Patent No.: US 7,309,530 B2
(45) Date of Patent: Dec. 18, 2007

(54) THERMAL BARRIER COATING WITH REDUCED SINTERING AND INCREASED IMPACT RESISTANCE, AND PROCESS OF MAKING SAME

(75) Inventors: Irene Spitsberg, Loveland, OH (US); Venkat S. Venkataramani, Clifton Park, NY (US); Brett Boutwell, Liberty Township, OH (US)

(73) Assignee: General Electric Company, Schenectady, NY (US)

( * ) Notice: Subject to any disclaimer, the term of this patent is extended or adjusted under 35 U.S.C. 154(b) by 46 days.

(21) Appl. No.: 10/925,125

(22) Filed: Aug. 24, 2004

(65) Prior Publication Data
US 2006/0046090 A1    Mar. 2, 2006

(51) Int. Cl.
*B32B 9/00* (2006.01)
*F03B 3/12* (2006.01)

(52) U.S. Cl. ............... 428/632; 428/702; 428/699; 428/697; 416/241 B

(58) Field of Classification Search ............... 428/632, 428/701, 702, 699, 697, 685, 667, 628, 627, 428/564, 565, 621, 680, 678; 416/241 B
See application file for complete search history.

(56) References Cited

U.S. PATENT DOCUMENTS

| | | | |
|---|---|---|---|
| 5,975,852 A | 11/1999 | Nagaraj et al. | 416/241 R |
| 5,981,088 A | 11/1999 | Bruce et al. | 428/633 |
| 5,998,003 A | 12/1999 | Courtright et al. | 428/216 |
| 6,025,078 A | 2/2000 | Rickerby et al. | 428/469 |
| 6,270,908 B1 | 8/2001 | Williams et al. | 428/469 |
| 6,352,788 B1 | 3/2002 | Bruce | 428/633 |
| 6,686,060 B2 * | 2/2004 | Bruce et al. | 428/633 |
| 6,858,334 B1 * | 2/2005 | Gorman et al. | 428/701 |
| 2003/0224200 A1 * | 12/2003 | Bruce | 428/632 |
| 2005/0036891 A1 | 2/2005 | Spitsberg et al. | |
| 2005/0064225 A1 * | 3/2005 | Leclercq et al. | 428/633 |
| 2005/0112412 A1 * | 5/2005 | Darolia et al. | 428/702 |

OTHER PUBLICATIONS

Raghavan, S., et al., "Thermal Properties of Zirconia Co-doped with Trivalent and Pentavalent Oxides", *Acta Materialia*, 49 (1), (Jan. 2001), 169-179.

Raghavan, Srinivasan, et al., "Ta2O5/Nb2O5 and Y2O3 Co-doped Zirconias for Thermal Barrier Coatings", *Journal of the American Ceramic Society*, vol. 87, No. 3,, (Mar. 2004),pp. 431-437.

* cited by examiner

*Primary Examiner*—G. Blackwell
(74) *Attorney, Agent, or Firm*—Bryn T. Lorentz; William Scott Andes

(57) ABSTRACT

A composition is disclosed that includes an at least partially stabilized zirconia matrix with a pentavalent oxide first dopant and an oxide second dopant. A coated article is disclosed for use in a high temperature a gas turbine. The coated article can include an yttria-stabilized zirconia, a pentavalent oxide first dopant, and an oxide second dopant. The ratio of the pentavalent oxide second dopant to the oxide third dopant can be less than or equal to about 1. The composition can reduce sintering of the thermal barrier coating.

12 Claims, 3 Drawing Sheets

THERMAL BARRIER COATING WITH REDUCED SINTERING AND INCREASED IMPACT RESISTANCE, AND PROCESS OF MAKING SAME

STATEMENT OF GOVERNMENT RIGHTS

This invention was made, at least in part, with a grant from the Government of the United States (Contract No. N00019-96-C-0176, from the Department of the Navy). The Government may have certain rights to the invention.

TECHNICAL FIELD

Embodiments relate to a thermal barrier coating. More particularly, embodiments relate to an article with a thermal barrier coating which is used in the gas path environment of a gas turbine engine. In particular, an embodiment relates to a gas turbine system which includes a coated turbine blade which acts as a thermal barrier coating.

TECHNICAL BACKGROUND

A thermal barrier coating (TBC) system may be used to protect the components of a gas turbine engine that are subjected to the highest material temperatures. The TBC system usually includes a bond coat that is deposited upon a superalloy substrate, and a ceramic TBC that is deposited upon the bond coat. The TBC acts as a thermal insulator against the heat of the hot combustion gas. The bond coat bonds the TBC to the substrate and also inhibits oxidation and corrosion of the substrate.

One currently used TBC is a stabilized zirconia, which is zirconia (zirconium oxide) with an oxide added to stabilize the zirconia against phase changes that otherwise occur as the TBC is heated and cooled during fabrication and service. The stabilized zirconia is deposited by a physical vapor deposition process such as electron beam physical vapor deposition (EBPVD). In this deposition process, the grains of the stabilized zirconia form as columnar structures that extend generally outwardly from and perpendicular to the substrate and the bond coat.

To be effective, the TBC system must have a low thermal conductivity and be strongly adherent to the article to which it is bonded under contemplated use conditions. To promote adhesion and to extend the service life of a TBC system, an oxidation-resistant bond coat is usually employed. Bond coats are typically in the form of overlay coatings such as MCrAlX, where M is a transition metal such as iron, cobalt, and/or nickel, and X is yttrium or another rare earth element. Bond coats are also diffusion coatings such as simple aluminide or platinum aluminide. A notable example of a diffusion aluminide bond coat contains a platinum intermetallic, e.g. NiPtAl. When a diffusion bond coat is applied, a zone of interdiffusion forms beneath a diffusion bond coat. This zone is typically referred to as a diffusion zone.

During exposure of the ceramic TBC and subsequent exposures to high temperatures such as during ordinary service use thereof, bond coats of the type described above oxidize to form a tightly adherent alumina scale that protects the underlying structure from catastrophic oxidation.

The columnar structure of the TBC system is of particular importance to adherence of the coating and to the coating maintaining a low thermal conductivity. In addition to gaps between columns, there also exists a fine porosity within subgrains in the columnar structure. The fine porosity is sometimes observed to be oriented substantially orthogonal to the columns.

As the stabilized zirconia is cycled to elevated temperatures during service, sintering creates the problems of both the large-grain, inter-columnar porosity and the subgrain, fine porosity being gradually closed. As a result, the ability of the stabilized zirconia to accommodate thermal expansion strains gradually is reduced, and the thermal conductivity of the stabilized zirconia gradually increases by about 20 percent or more.

It has been recognized that the addition of sintering inhibitors to the stabilized zirconia reduces the tendency of the gaps between the columnar grains to close by sintering during service of the thermal barrier coating. A number of sintering inhibitors have been proposed. However, these sintering inhibitors have various shortcomings, and there is a need for more effective sintering inhibitors.

Some of the physical demands of a gas turbine blade include operation in extreme environments. One condition to which a gas turbine blade is subjected is the erosive effect of small particles that pass across the turbine blade. The small particles can be generated a part of the combustion process inside a gas turbine. Another condition that a gas turbine blade is subjected to is foreign objects that come into the gas stream.

What is needed is a TBC that avoids at least some of the problems that existed in the prior art.

SUMMARY

A component article of a gas turbine engine is disclosed. The component article is applicable to a turbine blade or turbine vane. The component article includes a body that serves as a substrate. Overlying and contacting the substrate is a thermal barrier coating system such as a bond coat. The bond coat includes an optional metal first layer that is a metal such as platinum or the like. The bond coat also includes a metal upper layer that is a metal such as aluminum or the like.

In an embodiment, the bond coat includes a diffusion zone that is the result of interdiffusion of material from the bond coat with material from the substrate. In an embodiment, the process that deposits the metal upper layer above the substrate is performed at elevated temperature, so that during deposition, the material of the metal upper layer interdiffuses into and with the material of the substrate to form the diffusion zone.

The structure of the turbine blade is completed with a ceramic thermal barrier coating that overlies and contacts the bond coat surface and the alumina scale thereon. The ceramic thermal barrier coating includes an at least partially stabilized zirconia. The stabilizing element is referred to as the first dopant. Additionally, the ceramic thermal barrier coating includes at least one pentavalent oxide second dopant and an oxide third dopant that can be tri- or divalent.

The bond coat includes the optional metal first layer, if present, the metal upper layer, and the alumina scale. In an embodiment, the bond coat is a diffusion aluminide bond coat that is formed by depositing an aluminum-containing metal upper layer over the substrate, and by interdiffusing the aluminum-containing metal upper layer with the substrate. In an embodiment, the bond coat is a simple diffusion aluminide. In an embodiment, the bond coat is a more complex diffusion aluminide that includes another layer such as the metal first layer. In an embodiment, the metal first layer is a platinum layer.

In an embodiment, the entire bond coat includes a platinum-aluminide diffusion aluminide. In this embodiment, a platinum-containing metal first layer is first deposited onto the surface of the substrate. In an embodiment, other metals are used in place of or in addition to the platinum to form the metal first layer.

After formation of the metal first layer, if present, the metal upper layer is deposited above the substrate, and upon the metal first layer if present, by any operable approach. In an embodiment, an alumina scale forms at the bond coat surface by oxidation of the aluminum in the bond coat.

The ceramic thermal barrier coating is deposited by a process such as physical vapor deposition (PVD) process such as electron beam physical vapor deposition (EBPVD), or by the process of plasma spray deposition. In an embodiment, the ceramic thermal barrier coating is a YSZ ceramic matrix with at least one pentavalent oxide second dopant, and a tri- or divalent oxide third dopant.

Examples include YSZ that has been modified with additions of the pentavalent oxide second dopant. In an embodiment, the pentavalent oxide second dopant includes a pentavalent oxide selected from tantalum oxide, niobium oxide, combinations thereof, and the like.

In an embodiment, the pentavalent oxide second dopant includes in addition to at least one pentavalent oxide, an oxide third dopant that is a tri- or divalent oxide. In an embodiment, the oxide third dopant is selected from lanthanum oxide, combinations thereof, and the like. In an embodiment, the oxide third dopant includes one selected ytterbium oxide, gadolinium oxide, neodymium oxide, combinations thereof, and the like. In each enumerated embodiment, the pentavalent oxide second dopant and the oxide third dopant are co-deposited with the YSZ.

When prepared by a PVD process, the thermal barrier coating is formed generally of a plurality of columnar grains of the ceramic material that are affixed at their roots to the bond coat and the alumina scale. In some locations of the thermal barrier coating, there are gaps that add to the insulative quality of the thermal barrier coating.

Processing is carried out by forming the optional bond coat over the substrate. Additionally, the optional platinum layer can be formed before forming the bond coat. To form the alumina scale, the bond coat can be thermally treated. The thermal barrier coating is formed by a deposition process selected from EBPVD and plasma spraying.

These and other embodiments are set forth in the Detailed Description.

BRIEF DESCRIPTION OF THE DRAWINGS

In order to understand the manner in which embodiments are obtained, a more particular description of various embodiments briefly described above will be rendered by reference to the appended drawings. Understanding that these drawings depict only typical embodiments that are not necessarily drawn to scale and are not therefore to be considered to be limiting of its scope, the embodiments will be described and explained with additional specificity and detail through the use of the accompanying drawings in which.

DETAILED DESCRIPTION

Figure 1:
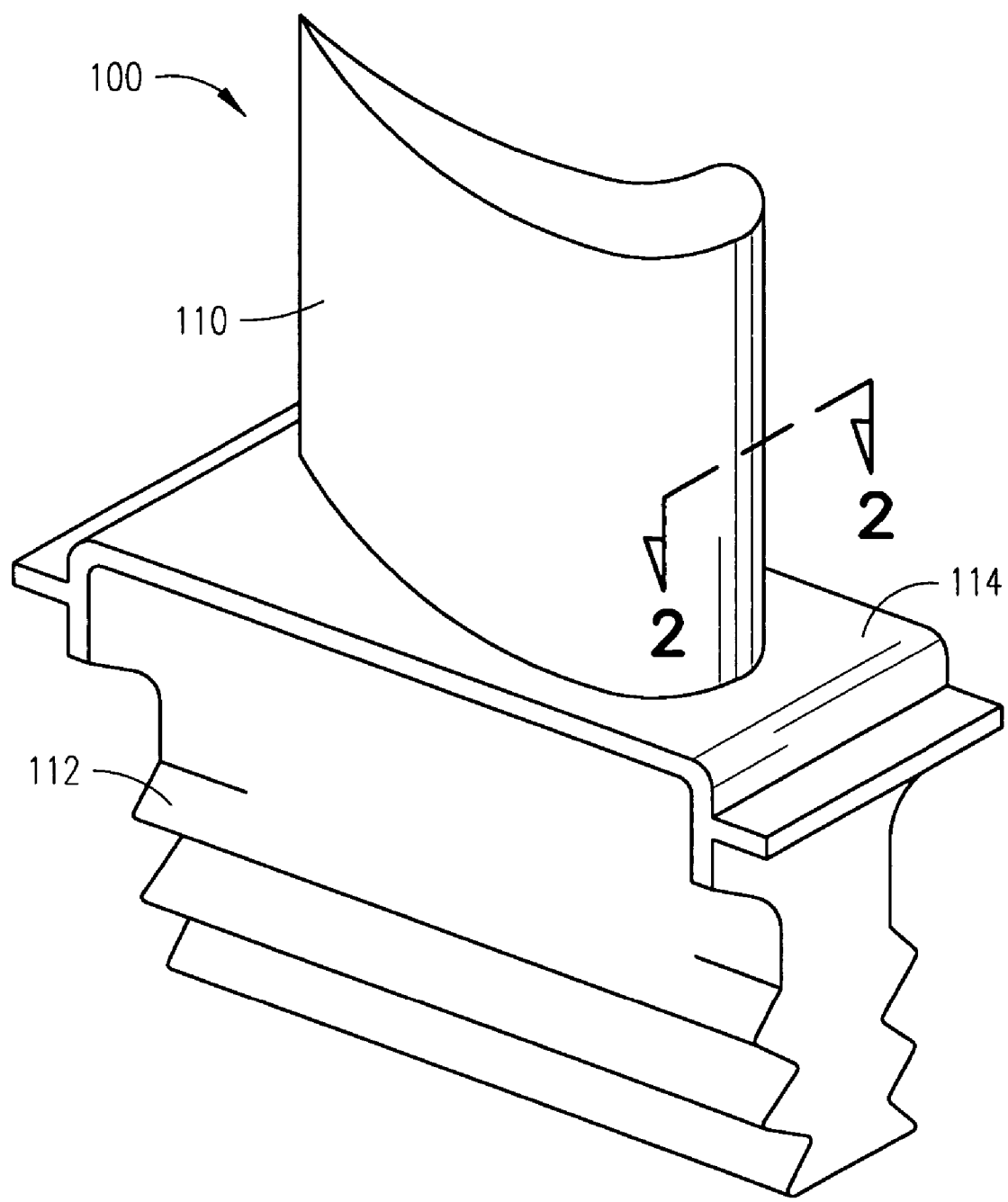
FIG. 1 depicts a component article of a gas turbine engine such as a turbine blade or turbine vane according to an embodiment.

The following description includes terms, such as first, second, etc. that are used for descriptive purposes only and are not to be construed as limiting. In the following detailed description, reference is made to the accompanying drawings, which form a part hereof. These drawings show, by way of illustration, specific embodiments in which the invention may be practiced. In the drawings, some of the like numerals describe substantially similar components throughout the several views. These embodiments are described in sufficient detail to enable those skilled in the art to practice the invention. Other embodiments may be used and structural changes may be made without departing from the scope of the several embodiments. Additionally, where compositions are given, if a composition is given with a percentage that is not modified by a term such as mol percent, volume percent, etc. it is understood that the percentage is given in weight percent.

FIG. 1 depicts a component article of a gas turbine engine such as a turbine blade or turbine vane according to an embodiment, and in this illustration a turbine blade 100. The turbine blade 100 is formed of any operable material. The turbine blade 100 includes an airfoil section 110 against which the flow of exhaust gas is directed. The turbine vane or nozzle has a similar appearance in respect to the pertinent airfoil section, but typically includes other end structure to support the airfoil. The turbine blade 100 is mounted to a turbine disk (not shown) by a dovetail 112 that extends downwardly from the airfoil 110 and engages a slot on the turbine disk. A platform 114 extends longitudinally outwardly from the area where the airfoil 110 is joined to the dovetail 112.

Figure 2:
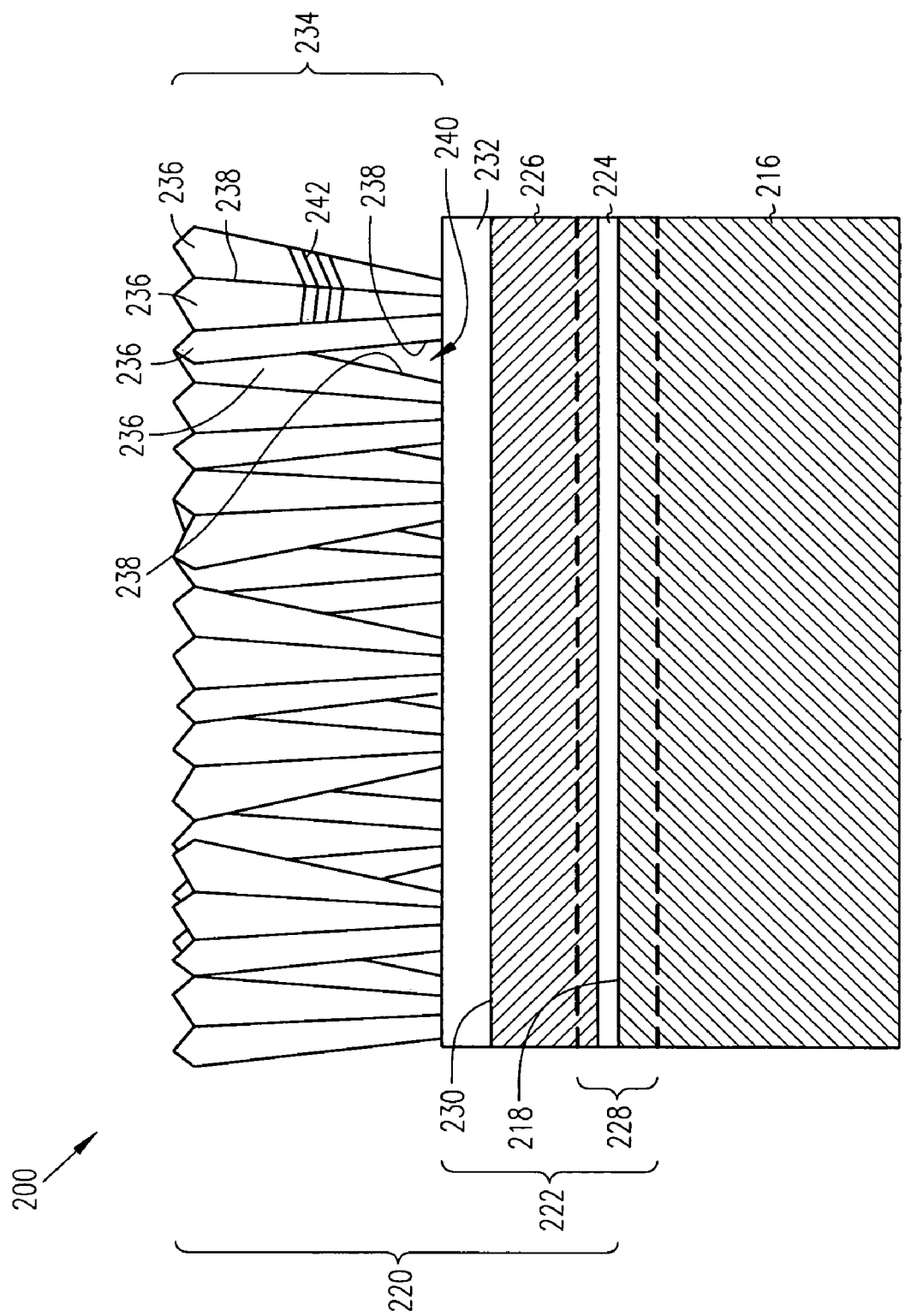
FIG. 2 is a computer image cross section, through a portion of the turbine blade depicted in FIG. 1 according to an embodiment.

FIG. 2 is a computer image cross section, through a portion of the turbine blade 100 according to an embodiment. The turbine blade 100 is depicted in FIG. 2 as the airfoil section 110 of FIG. 1, and it is enumerated in FIG. 2 as item 200. The turbine blade 200 has a body that serves as a substrate 216 with a substrate surface 218. Overlying and contacting the substrate surface 218, and also extending downwardly into the substrate 216, is a thermal barrier coating system 220 including a protective coating 222, which in this case is termed a bond coat 222. The bond coat 222 is thin and generally planar while conforming to and being bonded to the surface 218 of the substrate 216. In an embodiment, the bond coat 222 is in a thickness range from about 0.0005 inch to about 0.010 inch.

In an embodiment, the bond coat 222 includes an optional metal first layer 224 that is a metal such as platinum or the like. The bond coat 222 also includes a metal upper layer 226 that is a metal such as aluminum or the like. In an embodiment, the bond coat 222 includes a diffusion zone 228 that is the result of interdiffusion of material from the bond coat 222 with material from the substrate 216. In an embodiment, a process that deposits the metal upper layer 226 above the substrate surface 218 is performed at elevated temperature, so that during deposition, the material of the metal upper layer 226 interdiffuses into and with the material of the substrate 216, to form the diffusion zone 228. The diffusion zone 228, indicated by the dashed lines in FIG. 2, is a part of the thermal barrier coating system 200 but it extends downward into the substrate 216.

In an embodiment, the bond coat 222 has an outwardly facing bond coat surface 230 remote from the surface 218 of the substrate 216. In an embodiment, a ceramic interface such as alumina (aluminum oxide, or $Al_2O_3$) scale 232 that forms at this bond coat surface 230 by oxidation of the aluminum in the bond coat 220.

The structure of the turbine blade 200 is completed with a ceramic thermal barrier coating (TBC) 234 that overlies and contacts the bond coat surface 230 and the alumina scale 232 thereon. In an embodiment, the ceramic TBC 234 includes an at least partially stabilized zirconia first dopant with a pentavalent oxide second dopant in a concentration from about 0.5 mol percent to about 4 mol percent, and an oxide third dopant in a concentration from about 0.5 mol percent to about 4 mol percent. In an embodiment, the at least partially stabilized zirconia is at least partially stabilized with yttria. Although the yttria can be in a concentration range from about 3 to about 12 weight percent yttria, it is referred to herein as a first "dopant."

In an embodiment, the pentavalent oxide second dopant is in a concentration from about 0.5 mol percent to about 1.9 mol percent. In an embodiment, the pentavalent oxide second dopant is in a concentration from about 0.6 mol percent to about 1.8 mol percent. In an embodiment, the pentavalent oxide second dopant is in a concentration from about 0.9 mol percent to about 1.7 mol percent. In an embodiment, the pentavalent oxide second dopant is in a concentration from about 1 mol percent to about 1.6 mol percent. In an embodiment, the pentavalent oxide second dopant is in a concentration from about 1.1 mol percent to about 1.5 mol percent. In an embodiment, the pentavalent oxide second dopant is about 1.4 mol percent.

In an embodiment, the oxide third dopant is a tri- or divalent dopant. In an embodiment, the oxide second dopant is in a ratio to the oxide third dopant in a range from less than or equal to the oxide third dopant.

Substrate Materials

Reference is again made to FIG. 1. In an embodiment, the component article includes a component of a gas turbine engine such as a gas turbine blade 100 or vane (or "nozzle", as the vane is sometimes called). In an embodiment, the component article includes a single crystal substrate. In an embodiment, the component article is a preferentially oriented polycrystal, or a randomly oriented polycrystal. In an embodiment, the component article is made of a nickel-base superalloy for the substrate 216 (FIG. 2). As used herein, "nickel-base" means that the composition has more nickel present than any other element.

The nickel-base superalloys are typically of a composition that is strengthened by the precipitation of gamma-prime phase or a related phase. In an embodiment, the nickel-base alloy has a composition, in weight percent, of from about 4 to about 20 percent cobalt, from about 1 to about 10 percent chromium, from about 5 to about 7 percent aluminum, from 0 to about 2 percent molybdenum, from about 3 to about 8 percent tungsten, from about 4 to about 12 percent tantalum, from 0 to about 2 percent titanium, from 0 to about 8 percent rhenium, from 0 to about 6 percent ruthenium, from 0 to about 1 percent niobium, from 0 to about 0.1 percent carbon, from 0 to about 0.01 percent boron, from 0 to about 0.1 percent yttrium, from 0 to about 1.5 percent hafnium, balance nickel and incidental impurities.

In an embodiment, an alloy composition for the substrate 216 is Rene' N5, which has a nominal composition in weight percent of about 7.5 percent cobalt, about 7 percent chromium, about 6.2 percent aluminum, about 6.5 percent tantalum, about 5 percent tungsten, about 1.5 percent molybdenum, about 3 percent rhenium, about 0.05 percent carbon, about 0.004 percent boron, about 0.15 percent hafnium, up to about 0.01 percent yttrium, balance nickel and incidental impurities.

In an embodiment, an alloy composition for the substrate 216 is Rene' N6, which has a nominal composition in weight percent of about 12.5 percent cobalt, about 4.2 percent chromium, about 1.4 percent molybdenum, about 5.75 percent tungsten, about 5.4 percent rhenium, about 7.2 percent tantalum, about 5.75 percent aluminum, about 0.15 percent hafnium, about 0.05 percent carbon, about 0.004 percent boron, about 0.01 percent yttrium, balance nickel and incidental impurities.

In an embodiment, an alloy composition for the substrate 216 is Rene' 142, which has a nominal composition, in weight percent, of about 12 percent cobalt, about 6.8 percent chromium, about 1.5 percent molybdenum, about 4.9 percent tungsten, about 6.4 percent tantalum, about 6.2 percent aluminum, about 2.8 percent rhenium, about 1.5 percent hafnium, about 0.1 percent carbon, about 0.015 percent boron, balance nickel and incidental impurities.

In an embodiment, an alloy composition for the substrate 216 is CMSX-4, which has a nominal composition in weight percent of about 9.60 percent cobalt, about 6.6 percent chromium, about 0.60 percent molybdenum, about 6.4 percent tungsten, about 3.0 percent rhenium, about 6.5 percent tantalum, about 5.6 percent aluminum, about 1.0 percent titanium, about 0.10 percent hafnium, balance nickel and incidental impurities.

In an embodiment, an alloy composition for the substrate 216 is CMSX-10, which has a nominal composition in weight percent of about 7.00 percent cobalt, about 2.65 percent chromium, about 0.60 percent molybdenum, about 6.40 percent tungsten, about 5.50 percent rhenium, about 7.5 percent tantalum, about 5.80 percent aluminum, about 0.80 percent titanium, about 0.06 percent hafnium, about 0.4 percent niobium, balance nickel and incidental impurities.

In an embodiment, an alloy composition for the substrate 216 is PWA 1480, which has a nominal composition in weight percent of about 5.00 percent cobalt, about 10.0 percent chromium, about 4.00 percent tungsten, about 12.0 percent tantalum, about 5.00 percent aluminum, about 1.5 percent titanium, balance nickel and incidental impurities.

In an embodiment, an alloy composition for the substrate 216 is PWA1484, which has a nominal composition in weight percent of about 10.00 percent cobalt, about 5.00 percent chromium, about 2.00 percent molybdenum, about 6.00 percent tungsten, about 3.00 percent rhenium, about 8.70 percent tantalum, about 5.60 percent aluminum, about 0.10 percent hafnium, balance nickel and incidental impurities.

In an embodiment, an alloy composition for the substrate 216 is MX-4, which has a nominal composition as set forth in U.S. Pat. No. 5,482,789, in weight percent, of from about 0.4 to about 6.5 percent ruthenium, from about 4.5 to about 5.75 percent rhenium, from about 5.8 to about 10.7 percent tantalum, from about 4.25 to about 17.0 percent cobalt, from 0 to about 0.05 percent hafnium, from 0 to about 0.06 percent carbon, from 0 to about 0.01 percent boron, from 0 to about 0.02 percent yttrium, from about 0.9 to about 2.0 percent molybdenum, from about 1.25 to about 6.0 percent chromium, from 0 to about 1.0 percent niobium, from about 5.0 to about 6.6 percent aluminum, from 0 to about 1.0 percent titanium, from about 3.0 to about 7.5 percent tungsten, and wherein the sum of molybdenum plus chromium plus niobium is from about 2.15 to about 9.0 percent, and wherein the sum of aluminum plus titanium plus tungsten is from about 8.0 to about 15.1 percent, balance nickel and incidental impurities.

The use of the foregoing embodiments is not limited to these enumerated alloys, and has broader applicability.

Bond Coat Materials

The bond coat 222 includes the optional metal first layer 224, if present, the metal upper layer 226, and the alumina scale 232.

In an embodiment, the bond coat 222 is a diffusion aluminide bond coat which is formed by depositing an aluminum-containing metal upper layer 226 over the substrate 216, and by interdiffusing the aluminum-containing metal upper layer 226 with the substrate 216. In an embodiment, the bond coat 222 is a simple diffusion aluminide. In an embodiment, the bond coat 222 is a more complex diffusion aluminide that includes another layer such as the metal first layer 224. In an embodiment, the metal first layer 224 is a platinum layer.

Whether the bond coat 222 is a simple diffusion aluminide or a more complex diffusion aluminide, the aluminum-containing metal upper layer 226 may be doped with other elements that modify the bond coat 222. In an embodiment, the bond coat 222 includes an overlay coating known as an MCrAlX coating. The terminology "MCrAlX" is a shorthand term of art for a variety of families of overlay bond coats that may be employed as environmental coatings or bond coats in thermal barrier coating systems. In this and other forms, M refers to nickel, cobalt, iron, and combinations thereof. In some of these protective coatings, the chromium may be omitted. The X denotes elements such as hafnium, zirconium, yttrium, tantalum, rhenium, ruthenium, palladium, platinum, silicon, titanium, boron, carbon, and combinations thereof. Specific compositions are known in the art. Some examples of MCrAlX compositions include, for example, NiAlCrZr and NiAlZr, but this listing of examples is not to be taken as limiting.

In an embodiment, the entire bond coat 222 includes a platinum-aluminide diffusion aluminide. In this embodiment, a platinum-containing metal first layer 224 is first deposited onto the surface 218 of the substrate 216. In an embodiment, the platinum-containing metal first layer 224 is deposited by electrodeposition. In an embodiment, electrodeposition is accomplished by placing a platinum-containing solution into a deposition tank and depositing platinum from the solution onto the surface 218 of the substrate 216. An operable platinum-containing aqueous solution is $Pt(NH_3)_4HPO_4$ having a concentration of about 4-20 grams per liter of platinum, and the voltage/current source is operated at about ½-10 amperes per square foot of facing article surface. In an embodiment, the platinum metal first layer 224, is deposited in 1-4 hours at a temperature of 190-200° F. In an embodiment, the platinum metal first layer 224 is formed in a thickness range from about 0.00004 inch to about 0.00024 inch. In an embodiment, the platinum metal first layer 224 is about 0.0002 inch thick.

In an embodiment, other metals are used in place of or in addition to the platinum to form the metal first layer 224. Such metals and their combinations are known in the art.

After formation of the metal first layer 224, if present, the metal upper layer 226 is deposited above the substrate 216, and upon the metal first layer 224 if present, by any operable approach. In an embodiment, chemical vapor deposition (CVD) is used to form the metal upper layer 226. In that approach, a hydrogen halide activator gas, such as hydrogen chloride, is contacted with aluminum metal or an aluminum alloy to form the corresponding aluminum halide gas. Halides of any modifying elements are formed by the same technique. The aluminum halide (or mixture of aluminum halide and halide of the modifying element, if any) contacts the platinum-containing metal first layer 224 that overlies the substrate 216, depositing the aluminum thereon. In an embodiment, the deposition occurs at elevated temperature such as from about 1,825° F. to about 1,975° F. so that the deposited aluminum atoms interdiffuse into the substrate 216 during a 4 to 20 hour cycle.

In an embodiment, an alumina (aluminum oxide, or $Al_2O_3$) scale 232 forms at this bond coat surface 230 by oxidation of the aluminum in the bond coat 220 at the bond coat surface 230. Where the metal upper layer is a complex aluminum compound, a modified "alumina" scale 232 correspondingly forms the scale 232.

Thermal Barrier Coatings

The ceramic thermal barrier coating (TBC) 234 is deposited by a process such as physical vapor deposition process such as electron beam physical vapor deposition (EBPVD), or by the process of plasma spray deposition. In an embodiment, the ceramic TBC 234 has a thickness from about 0.003 inch to about 0.010 inch thick. In an embodiment, the ceramic TBC 234 has a thickness of about 0.005 inch thick.

In an embodiment, the ceramic TBC 234 includes a ceramic matrix of an at least partially stabilized zirconia that is stabilized with a first dopant such as yttria. Additionally, the ceramic TBC includes a pentavalent oxide second dopant and a tri- or divalent oxide third dopant. In an embodiment, the zirconia ceramic matrix is at least partially stabilized with an yttria (yttrium oxide) first dopant, the addition of the pentavalent oxide second dopant, and the tri- or divalent oxide third dopant. Other stabilizers can be used as the first dopant in lieu of or in addition to yttria to at least partially stabilize the zirconia matrix.

In an embodiment, the ceramic TBC 234 is a YSZ, which is zirconium oxide containing from about 3 to about 12 weight percent yttria. Technically, the stabilizing oxide, e.g. yttria, is the first dopant. In an embodiment, the ceramic TBC 234 is from about 4 to about 8 weight percent, of yttria.

Example embodiments for the TBC 234 include an at least partially stabilized zirconia that has been modified with additions of the pentavalent oxide second dopant in disclosed proportions, and the tri- or divalent oxide third dopant. The tri- or divalent oxide third dopant is referred to because of the presence of the stabilizing oxide first dopant such as yttria or other stabilizers, the oxide second dopant because of the pentavalent oxide second dopant, and the tri- or divalent oxide third dopant as set forth in this disclosure. Claimed embodiments therefore refer to the "second" oxide as the pentavalent second oxide or second dopant, and the oxide third dopant to include tri- or divalent dopant, for example, as the oxide third dopant.

In an embodiment, the oxide third dopant includes a trivalent oxide such as lanthanum oxide, and the like. In an embodiment, the oxide third dopant includes one selected ytterbium oxide, gadolinium oxide, neodymium oxide, combinations thereof, and the like. In an embodiment, the oxide third dopant included an oxide of a Group II element such as CaO, MgO, and the like. In each enumerated embodiment, the oxide third dopant is co-deposited with the pentavalent oxide second dopant, and the stabilizing oxide first dopant such as the yttrium in YSZ.

In an embodiment, the zirconia ceramic matrix includes YSZ with about 4 to about 8 percent by weight of yttria, which can be referred to as 4-8 YSZ. In this embodiment, the 4-8 YSZ matrix includes a pentavalent oxide second dopant in a concentration from about 0.5 mol percent to about 4 mol percent, and the tri- or divalent oxide third dopant. In an embodiment, the 4-8 YSZ matrix includes a pentavalent oxide second dopant in a concentration of about 1.6 mol percent.

In an embodiment, the pentavalent oxide second dopant includes tantala, $Ta_2O_5$. In an embodiment, the pentavalent oxide second dopant includes tantala in a major amount and at least one other pentavalent oxide such as niobia or niobium oxide. In an embodiment, the pentavalent oxide second dopant includes a tantalum oxide as a non-stoichiometric solid solution within the ceramic matrix. In another embodiment, the pentavalent oxide second dopant includes a tantalum oxide in a major amount as a non-stoichiometric solid solution within the ceramic matrix, and at least one other pentavalent oxide such as niobia or niobium oxide. In an embodiment, the pentavalent oxide second dopant includes tantala in a range from about 0.5 mol percent to about 4 mol percent. In an embodiment, the pentavalent oxide second dopant includes tantala in a range from about 1.3 mol percent to about 1.9 mol percent. In an embodiment, the pentavalent oxide second dopant includes tantala in a range from about 1.4 mol percent to about 1.8 mol percent. In an embodiment, the pentavalent oxide second dopant includes about 1.6 mol percent tantala in a 7 YSZ ceramic matrix.

In an embodiment, the pentavalent oxide second dopant includes niobia, $Nb_2O_5$. In an embodiment, the pentavalent oxide second dopant includes niobia in a major amount and at least one other pentavalent oxide such as tantala or tantalum oxide. In an embodiment, the pentavalent oxide second dopant includes a niobium oxide as a non-stoichiometric solid solution within the ceramic matrix. In another alternative embodiment, the pentavalent oxide second dopant includes a niobium oxide in a major amount as a non-stoichiometric solid solution within the ceramic matrix, and at least one other pentavalent oxide such as tantala or tantalum oxide.

In an embodiment, the pentavalent oxide second dopant includes niobia in a range from about 0.5 mol percent to about 4 mol percent. In an embodiment, the pentavalent oxide second dopant includes niobia in a range from about 1.2 mol percent to about 1.8 mol percent. In an embodiment, the pentavalent oxide second dopant includes about 1.6 mol percent niobia in a 7 YSZ ceramic matrix.

The TBC 234 can include one of the various ceramic matrix embodiments that are set forth herein. In an embodiment, yttria in the thermal barrier coating 234 is present in an amount of about 7 percent. The pentavalent oxide second dopant is selected from $Ta_2O_5$, $Nb_2O_5$, and a combination thereof, and is present in a range from about 0.5 mol percent to about 4 mol percent. In an embodiment, the pentavalent oxide second dopant is selected from $Ta_2O_5$, $Nb_2O_5$, and a combination thereof, and is present in a range from about 1.3 mol percent to about 3 mol percent. In an embodiment, the pentavalent oxide second dopant is selected from $Ta_2O_5$, $Nb_2O_5$, and a combination thereof, and is present in a range from about 1.5 mol percent to about 2 mol percent. In an embodiment, the pentavalent oxide second dopant is selected from $Ta_2O_5$, $Nb_2O_5$, and a combination thereof, and is present at about 1.6 mol percent.

As illustrated schematically in FIG. 2, when prepared by a PVD process, the TBC 234 is formed generally of a plurality of columnar grains 236 of the ceramic material that are affixed at their roots to the bond coat 222 and the alumina scale 232. The columnar grains 236 have grain surfaces 238. In some locations of the TBC 234, there are gaps 240, whose size is exaggerated in FIG. 2 for the purposes of illustration, between the grains 236 and their facing grain surfaces 238.

In an embodiment, the ceramic TBC 234 is formed by EBPVD that forms a subgrain 242. The subgrain 242 is illustrated schematically in a selected portion of some of the columnar grains 236. In FIG. 2, the subgrain 242 includes a subgrain boundary and a subgrain body. The subgrain boundary is depicted schematically as a diagonal line. The subgrain body is depicted schematically as the space between two diagonal lines.

This morphology of the TBC 236 including the columnar grains 236 with their corresponding gaps 240 and the subgrains 242 is beneficial to the functioning of the TBC 236. The gaps 240 allow the substrate 216, the bond coat 222 including the alumina scale 232, and the TBC 234 to expand and contract without significantly damaging morphological changes therein. Because the TBC 234 is a ceramic material, it has a generally low ductility so that the accumulated stresses would be likely to cause failure. With the gaps 240 present, however, the in-plane stresses in the TBC 236 are developed across only one or at most a group of a few of the columnar grains 236. That is, all of the columnar grains 236 have in-plane stresses, but the magnitude of the in-plane stresses are relatively low because the strains do not accumulate over long distances. The result is that the TBC 234 with the columnar grains 236 and gaps 240 is less likely to fail by in-plane overstressing during service. Additionally, the gaps 240 are filled with air, which when relatively stagnant between the grains 236 is an effective thermal insulator, aiding the TBC 234 in performing its primary role.

Figure 3:
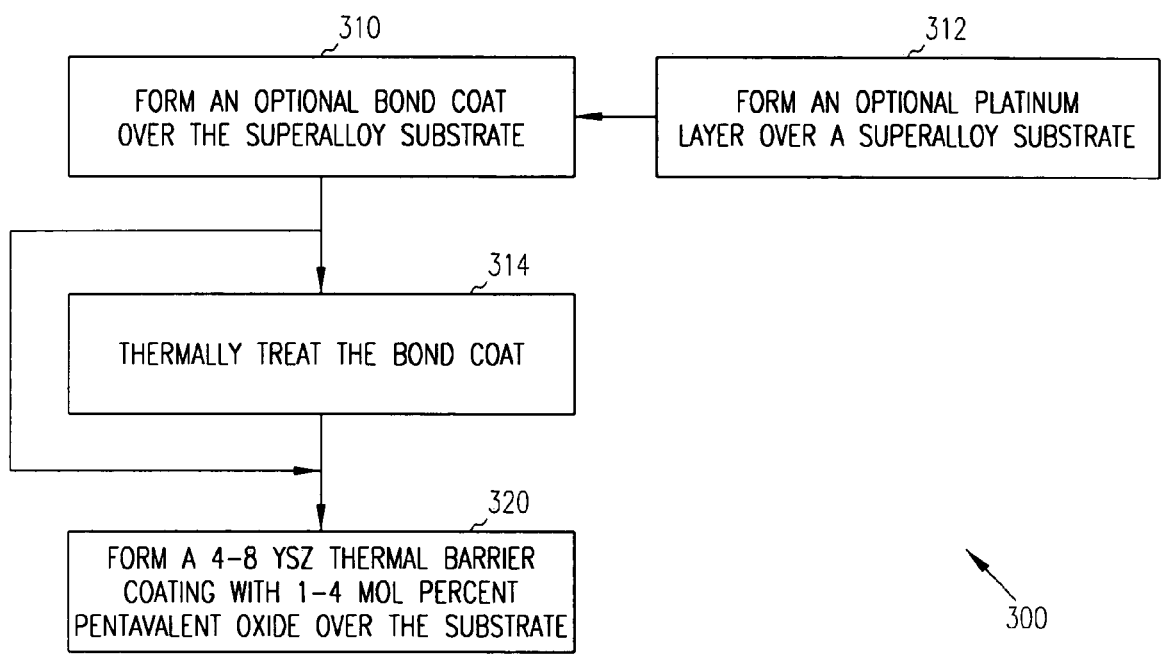
FIG. 3 is a process flow diagram according to an embodiment.

FIG. 3 is a block diagram of a process embodiment. The process 300 includes forming the thermal barrier coating, and optionally forming the bond coating.

At 310, an optional bond coat is formed over the substrate.

At 312, the optional platinum layer is formed before forming the bond coat.

At 314, the bond coat is optionally thermally treated to form the "alumina" scale 232 as set forth herein according to several embodiments.

At 320, the thermal barrier coating is formed by a deposition process selected from EBPVD and plasma spraying.

EXAMPLE 1

An EB-PVD technique was used to form a coating on a substrate. The coating was 7 YSZ that included about 4.3 mol percent of $Nd_2O_3$ as the pentavalent oxide second dopant and about 5.8 mol percent of $Ta_2O_5$ as an oxide third dopant. After the TBC was applied, thermal cycling (TC) was done to obtain a metric on sintering resistance. The coating was heated to about 1,200° C. for about 2 hours in air. The coating had an observed change in thermal conductivity from about 2.5 W/m K before TC to about 3 W/m K after TC, respectively. Evaluation of the thermal conductivity was conducted by the laser flash method known in the art.

EXAMPLE 2

An EB-PVD technique was used to form a coating on a substrate. The coating was 7 YSZ that included about 6.9 mol percent of $Ta_2O_5$ as the pentavalent oxide second dopant and about 5.8 mol percent of $La_2O_3$ as the oxide third dopant. After the TBC was applied, TC was done to obtain a metric on sintering resistance. The coating was heated to about 1,200° C. for about 2 hours in air. The coating had an observed change in thermal conductivity from about 1.7 W/m K before TC to about 2.1 W/m K after TC, respectively. Evaluation of the thermal conductivity was conducted by the laser flash method.

EXAMPLE 3

An EB-PVD technique was used to form a coating on a substrate. The coating was 7 YSZ that included about 0.8 mol percent of $Nd_2O_3$ as the pentavalent oxide second dopant and about 0.6 mol percent of $Ta_2O_5$ as the oxide third dopant. After the TBC was applied thermal conductivity was measured to evaluate sintering resistance. The coating was thereafter heated to about 1,200° C. for about 2 hours in air and thermal conductivity was measured again to attain a metric on sintering resistance. The coating had an observed change in thermal conductivity from about 1.5 W/m K before TC to about 1.6 W/m K after TC, respectively. Evaluation of the thermal conductivity was conducted by the laser flash method.

EXAMPLE 4

An EB-PVD technique was used to form a coating on a substrate. The coating was 7 YSZ that included about 0.9 mol percent of $Ta_2O_5$ as the pentavalent oxide second dopant and about 0.9 mol percent of $Yb_2O_3$ as the oxide third dopant. After the TBC was applied, TC was done to obtain a metric on sintering resistance. The coating was heated to about 1,200° C. for about 2 hours in air. The coating had no observed change in thermal conductivity; the thermal conductivity was measured at about 1.6 W/m K before TC and virtually about 1.6 W/m K after TC, respectively. Evaluation of the thermal conductivity was conducted by the laser flash method.

It is noted that the results of Examples 3 and 4 show an increased sintering resistance over that of Examples 1 and 2.

COMPARATIVE EXAMPLE

An EB-PVD technique was used to form a coating on a substrate. The coating was a 7 YSZ. After the TBC was applied, TC was done by heating the coating to about 1,200° C. for about 2 hours in air. Seven baseline samples were so processed, and an average of their tests was taken for the baseline numbers. After the TC the coated substrate had an observed change in thermal conductivity from about 1.53 W/m K to about 2.02 W/m K.

From the comparative example, it is noted that the previous examples and embodiments exhibited significant sintering resistance when the molar ratio of the pentavalent second oxide to the tri- or divalent third oxide is less than or equal to about one. It is noted, however, that the results of Examples 3 and 4 show an increased sintering resistance over that of Examples 1 and 2.

Gas Turbines

In an embodiment, a system is disclosed that includes a gas turbine. In an embodiment, the gas turbine includes a composition and structure similar to the computer drawing depicted in FIG. 2. In an embodiment, the gas turbine includes a coated article according to embodiments set forth in this disclosure such as is depicted in FIG. 2. In an embodiment, the gas turbine includes a turbine blade according to embodiments set forth in this disclosure such as is depicted in FIG. 1.

The Abstract is provided to comply with 37 C.F.R. §1.72(b) requiring an Abstract that will allow the reader to quickly ascertain the nature and gist of the technical disclosure. It is submitted with the understanding that it will not be used to interpret or limit the scope or meaning of the claims.

In the foregoing Detailed Description, various features are grouped together in a single embodiment for the purpose of streamlining the disclosure. This method of disclosure is not to be interpreted as reflecting an intention that the claimed embodiments of the invention require more features than are expressly recited in each claim. Rather, as the following claims reflect, inventive subject matter lies in less than all features of a single disclosed embodiment. Thus the following claims are hereby incorporated into the Detailed Description of Embodiments of the Invention, with each claim standing on its own as a separate preferred embodiment.

It will be readily understood to those skilled in the art that various other changes in the details, material, and arrangements of the parts and method stages which have been described and illustrated in order to explain the nature of this invention may be made without departing from the principles and scope of the invention as expressed in the subjoined claims.

What is claimed is:

1. A composition comprising:
   a ceramic matrix including an at least partially stabilized zirconia, wherein the at least partially stabilized zirconia includes an yttria first dopant;
   a pentavalent oxide second dopant in a concentration of about 0.8 mol percent, wherein the pentavalent second dopant includes one selected from niobia ($Nb_2O_5$) and niobium oxide as a non-stoichiometric solid solution, in a major amount and at least one other pentavalent oxide of tantala; and
   an oxide third dopant in a concentration of about 0.6 mol percent neodymia, and wherein the pentavalent oxide second dopant is in a ratio to the oxide third dopant of less than or equal to about 1, and wherein the composition exhibits a thermal conductivity of about 1.6 W/(m K) after being heated to about 1,200° C. for about 2 hours.

2. The composition of claim 1, wherein the at least partially stabilized zirconia includes yttria in a range from about 4 percent to about 8 percent.

3. The composition of claim 1, wherein the pentavalent second dopant includes one selected from tantala ($Ta_2O_5$) and tantalum oxide as a non-stoichiometric solid solution, in a major amount and at least one other pentavalent oxide.

4. A composition comprising:
   a ceramic matrix including an at least partially stabilized zirconia, wherein the at least partially stabilized zirconia includes an yttria first dopant;
   a pentavalent oxide second dopant in a concentration of about 0.9 mol percent, wherein the pentavalent second dopant includes one selected from niobia ($Nb_2O_5$) and niobium oxide as a non-stoichiometric solid solution, in a major amount and at least one other pentavalent oxide of tantala; and
   an oxide third dopant in a concentration of about 0.9 mol percent ytterbia, and wherein the pentavalent oxide second dopant is in a ratio to the oxide third dopant of less than or equal to about 1, and wherein the composition exhibits a thermal conductivity of about 1.6 W/(m K) after being heated to about 1,200° C. for about 2 hours.

5. A coated article, comprising:
   a superalloy substrate;
   a bond coat disposed above the superalloy substrate;
   a ceramic interface disposed above the bond coat; and
   a thermal barrier coating disposed above the ceramic interface including:

a ceramic matrix including an at least partially stabilized zirconia, wherein the ceramic matrix is at least partially stabilized with a first dopant; and one of a pentavalent oxide second dopant in a concentration of about 0.8 mol percent tantala, and an oxide third dopant in a concentration of about 0.6 mol percent neodymia; or a pentavalent oxide second dopant in a concentration of about 0.9 mol percent, wherein the pentavalent second dopant includes one selected from niobia ($Nb_2O_5$) and niobium oxide as a non-stoichiometric solid solution, in a major amount and at least one other pentavalent oxide of tantala, and an oxide third dopant in a concentration of about 0.9 mol percent ytterbia, wherein the pentavalent oxide second dopant is in a ratio to the oxide third dopant of less than or equal to about 1, and wherein the composition exhibits a thermal conductivity of about 1.6 W/(m K) after being heated to about 1,200° C. for about 2 hours.

6. The coated article of claim 5, wherein the ceramic matrix includes about 4 mol percent yttrium oxide first dopant.

7. The coated article of claim 5, wherein the pentavalent oxide second dopant is selected from $Ta_2O_5$, tantalum oxide, $Nb_2O_5$, niobium oxide, and combinations thereof.

8. The coated article of claim 5, wherein the pentavalent oxide second dopant is selected from niobia ($Nb_2O_5$) and niobium oxide as a non-stoichiometric solid solution in a major amount, and at least one other pentavalent oxide.

9. A coated turbine blade comprising:
a turbine blade substrate including a superalloy; and
a turbine blade coating above the turbine blade substrate, including:
a ceramic matrix including an at least partially stabilized zirconia, wherein the ceramic matrix is at least partially stabilized with a first dopant; and one of
a pentavalent oxide second dopant in a concentration of about 0.8 mol percent tantala, and an oxide third dopant in a concentration of about 0.6 mol percent neodymia; or
a pentavalent oxide second dopant in a concentration of about 0.9 mol percent, wherein the pentavalent second dopant includes one selected from niobia ($Nb_2O_5$) and niobium oxide as a non-stoichiometric solid solution, in a major amount and at least one other pentavalent oxide of tantala, and an oxide third dopant in a concentration of about 0.9 mol percent ytterbia, wherein the pentavalent oxide second dopant is in a ratio to the oxide third dopant of less than or equal to about 1, and wherein the composition exhibits a thermal conductivity of about 1.6 W/(m K) after being heated to about 1,200° C. for about 2 hours.

10. The coated turbine blade of claim 9, wherein the turbine blade coating includes a bond coat including aluminum.

11. A system comprising:
a gas turbine, and within the gas turbine a turbine blade, including:
a superalloy substrate;
a bond coating disposed above the superalloy substrate;
a ceramic interface disposed above the bond coating; and
a thermal barrier coating disposed above the ceramic interface including:
a ceramic matrix including an at least partially stabilized zirconia, wherein the ceramic matrix is at least partially stabilized with a first dopant; and one of
a pentavalent oxide second dopant in a concentration of about 0.8 mol percent, wherein the pentavalent second dopant includes one selected from niobia ($Nb_2O_5$) and niobium oxide as a non-stoichiometric solid solution, in a major amount and at least one other pentavalent oxide of tantala, and an oxide third dopant in a concentration of about 0.6 mol percent neodymia; or
a pentavalent oxide second dopant in a concentration of about 0.9 mol percent tantala, and an oxide third dopant in a concentration of about 0.9 mol percent ytterbia, and wherein the pentavalent oxide second dopant is in a ratio to the oxide third dopant of less than or equal to about 1, and wherein the composition exhibits a thermal conductivity of about 1.6 W/(m K) after being heated to about 1,200° C. for about 2 hours.

12. The system of claim 11, wherein the oxide third dopant includes and oxide selected from a trivalent oxide dopant, a divalent oxide dopant, and combinations thereof.

* * * * *